United States Patent
Nanami (10) Patent No.: US 10,991,715 B2
(45) Date of Patent: Apr. 27, 2021

(54) SEMICONDUCTOR MEMORY DEVICE AND METHOD OF MANUFACTURING SEMICONDUCTOR MEMORY DEVICE

(71) Applicant: TOSHIBA MEMORY CORPORATION, Minato-ku (JP)

(72) Inventor: Kyosuke Nanami, Yokkaichi (JP)

(73) Assignee: TOSHIBA MEMORY CORPORATION, Minato-ku (JP)

( * ) Notice: Subject to any disclaimer, the term of this patent is extended or adjusted under 35 U.S.C. 154(b) by 0 days.

(21) Appl. No.: 16/294,445

(22) Filed: Mar. 6, 2019

(65) Prior Publication Data
US 2020/0075628 A1    Mar. 5, 2020

(30) Foreign Application Priority Data

Aug. 28, 2018 (JP) .............................. JP2018-159666

(51) Int. Cl.
| | |
|---|---|
| H01L 23/522 | (2006.01) |
| H01L 27/11582 | (2017.01) |
| H01L 21/311 | (2006.01) |
| H01L 23/528 | (2006.01) |
| H01L 21/28 | (2006.01) |

(52) U.S. Cl.
CPC ... *H01L 27/11582* (2013.01); *H01L 21/31111* (2013.01); *H01L 23/5226* (2013.01); *H01L 23/5283* (2013.01); *H01L 29/40117* (2019.08)

(58) Field of Classification Search
CPC ......... H01L 27/11582; H01L 29/40117; H01L 23/5226
See application file for complete search history.

(56) References Cited

U.S. PATENT DOCUMENTS

| | | | |
|---|---|---|---|
| 9,793,293 B1 * | 10/2017 | Horibe | .................. H01L 21/283 |
| 2010/0013049 A1 | 1/2010 | Tanaka et al. | |
| 2011/0180866 A1 | 7/2011 | Matsuda et al. | |
| 2015/0179564 A1 * | 6/2015 | Lee | ..................... H01L 23/5226 257/756 |
| 2015/0255484 A1 * | 9/2015 | Imamura | ........... H01L 29/66833 257/314 |

(Continued)

FOREIGN PATENT DOCUMENTS

| | | |
|---|---|---|
| JP | 2010-27870 | 2/2010 |
| JP | 2011-151316 | 8/2011 |
| JP | 2017-130644 | 7/2017 |

*Primary Examiner* — Laura M Menz
*Assistant Examiner* — Khatib A Rahman
(74) *Attorney, Agent, or Firm* — Oblon, McClelland, Maier & Neustadt, L.L.P.

(57) ABSTRACT

According to one embodiment, a semiconductor memory device includes: a stack body having a step structure body with a plurality of wire line layers and a plurality of interlayer insulating layers alternately stacked being set as one step on a substrate; and memory cells arranged three-dimensionally in the stack body, in which the step structure body includes: a plurality of terrace portions configured with the interlayer insulating layers, the plurality of terrace portions having different heights; a plurality of step portions connecting the respective terrace portions in a height direction; insulating layers covering the step portions; and a lead wire line leading out a lowermost wire line layer of a first step onto the terrace portion of a second step being a lower step of the first step.

9 Claims, 8 Drawing Sheets

(56) References Cited

U.S. PATENT DOCUMENTS

| | | | |
|---|---|---|---|
| 2015/0270165 A1* | 9/2015 | Hyun | H01L 27/11524 |
| | | | 257/329 |
| 2017/0213840 A1* | 7/2017 | Sudo | H01L 27/1157 |
| 2017/0338240 A1* | 11/2017 | Nogami | H01L 23/5226 |
| 2018/0277558 A1* | 9/2018 | Lee | H01L 27/11568 |
| 2018/0315758 A1* | 11/2018 | Yoo | H01L 21/76895 |

* cited by examiner

SEMICONDUCTOR MEMORY DEVICE AND METHOD OF MANUFACTURING SEMICONDUCTOR MEMORY DEVICE

CROSS-REFERENCE TO RELATED APPLICATIONS

This application is based upon and claims the benefit of priority from Japanese Patent Application No. 2018-159666, filed on Aug. 28, 2018; the entire contents of which are incorporated herein by reference.

FIELD

Embodiments described herein relate generally to a semiconductor memory device and a method of manufacturing a semiconductor memory device.

BACKGROUND

In recent years, miniaturization of semiconductor memory devices has progressed, and three-dimensional nonvolatile memories having a stack structure of memory cells have been proposed. In the three-dimensional nonvolatile memory, in some cases, a step-shaped structure is adopted in order to lead out the word line in each layer of the memory cells arranged in the height direction.

However, in order to obtain such a structure, precise process control is required, and it is difficult to obtain a sufficient process margin.

BRIEF DESCRIPTION OF THE DRAWINGS

FIG. 8Ba is a diagram illustrating the step structure body of the nonvolatile memory according to Comparative Example;

FIG. 8Bb is a diagram illustrating the step structure body of the nonvolatile memory according to Comparative Example;

FIG. 8Ca is a diagram illustrating the step structure body of the nonvolatile memory according to Comparative Example; and FIG. 8Cb is a diagram illustrating the step structure body of the nonvolatile memory according to Comparative Example.

DETAILED DESCRIPTION

A semiconductor memory device according to an embodiment includes: a stack body having a step structure body with a plurality of wire line layers and a plurality of interlayer insulating layers alternately stacked being set as one step on a substrate; and memory cells arranged three-dimensionally in the stack body, in which the step structure body includes: a plurality of terrace portions configured with the interlayer insulating layers, the plurality of terrace portions having different heights; a plurality of step portions connecting the respective terrace portions in a height direction; insulating layers covering the step portions; and a lead wire line leading out a lowermost wire line layer of a first step onto the terrace portion of a second step being a lower step of the first step.

Hereinafter, the invention will be described in detail with reference to the drawings. In addition, the invention is not limited by the following embodiments. In addition, components in the following embodiments include those that can be easily assumed by those skilled in the art or those that are substantially the same.

(Example of Configuration of Nonvolatile Memory)

Figure 1:
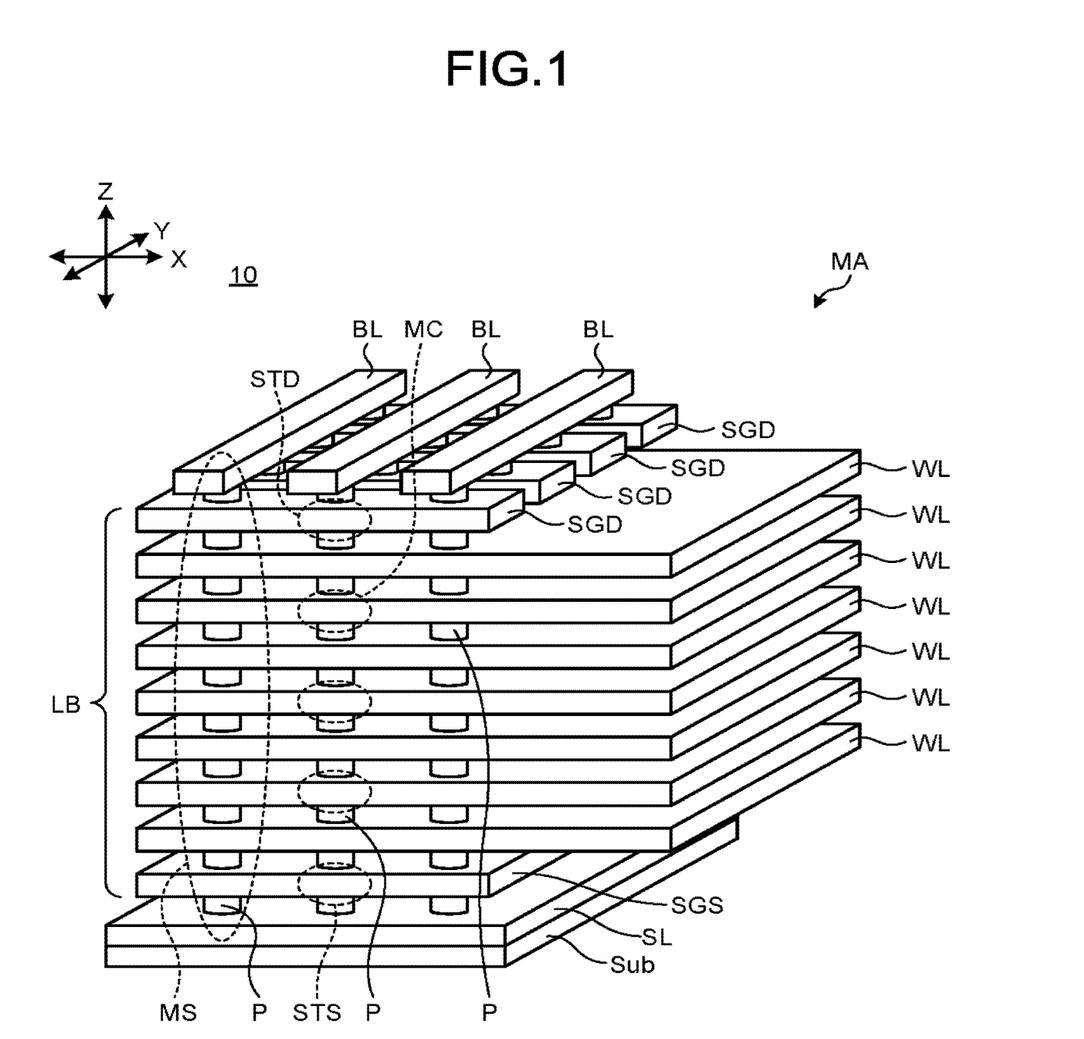
FIG. 1 is a diagram schematically illustrating an example of a configuration of a nonvolatile memory according to an embodiment.

FIG. 1 is a diagram schematically illustrating an example of a configuration of a nonvolatile memory 10 according to an embodiment. In FIG. 1, two directions that are directions parallel to a main surface of a substrate Sub and perpendicular to each other are defined as an X direction and a Y direction. A direction perpendicular to both the X direction and the Y direction is defined as a Z direction (stacking direction). In FIG. 1, an interlayer insulating layer or the like is omitted.

As illustrated in FIG. 1, a source line SL configured with a conductive layer is provided on the substrate Sub of the nonvolatile memory 10 as a semiconductor memory device. A plurality of pillars P made of silicon oxide or the like extending in the Z direction are provided on the source line SL. Each pillar P has a channel layer made of polysilicon or the like and a memory layer in which a plurality of insulating layers are stacked on a side surface of the pillar itself. In addition, on the source line SL, a stack body LB in which a plurality of conductive layers made of tungsten or the like and a plurality of insulating layers made of silicon oxide or the like are alternately stacked is provided with an interlayer insulating layer (not illustrated) interposed therebetween. Each pillar P penetrates the stack body LB.

The lowermost conductive layer in the stack body LB functions as a source side selection gate line SGS, and the uppermost conductive layer functions as a drain side selection gate line SGD. The selection gate line SGD is divided for each pillar P aligned in the X direction. The plurality of conductive layers interposed between the selection gate lines SGS and SGD function as a plurality of word lines WL. The number of stacked word lines WL illustrated in FIG. 1 is an example. The insulating layers between the selection gate lines SGS and SGD and the plurality of word lines WL function as interlayer insulating layer (not illustrated).

Each pillar P is connected to a bit line BL above the stack body LB. Each bit line BL is connected to the plurality of pillars P aligned in the Y direction.

As described above, memory cells MC aligned in the height direction of the pillar P are aligned in the connection portion between each pillar P and the word line WL of each layer. A source side selection transistor STS and a drain side selection transistor STD are respectively disposed in the connection portion between each pillar P and the selection gate lines SGS and SGD. The selection transistor STS, the plurality of memory cells MC, and the selection transistor STD aligned in the height direction of one pillar P constitute a memory string MS. In addition, a memory cell array MA is configured with the memory cells MC three-dimensionally arranged in a matrix shape.

The selection gate lines SGS and SGD and the plurality of word lines WL are led out of the memory cell array MA in the X direction to form a step-shaped structure.

(Configuration Example of Step Structure Body)

Figure 2:
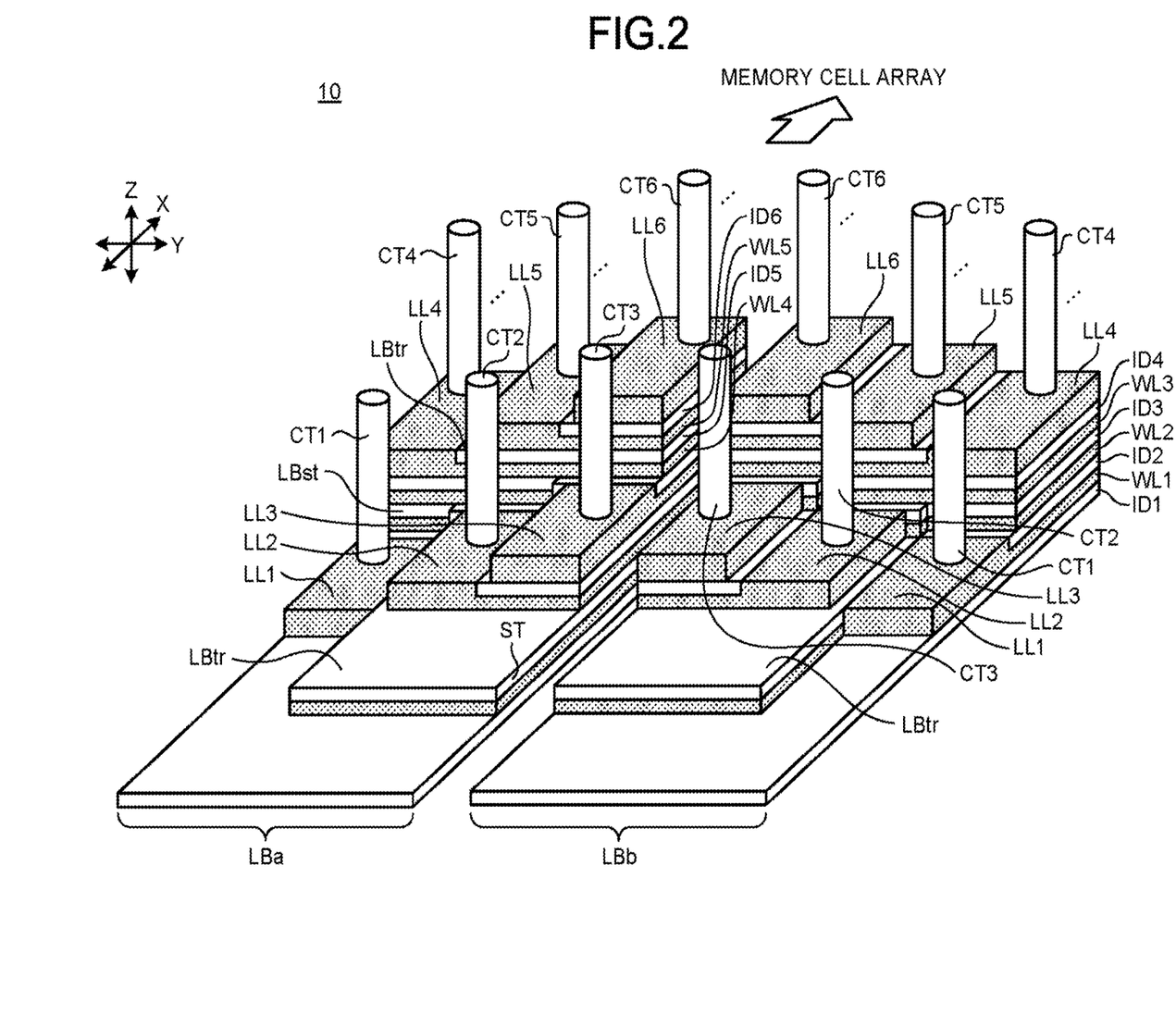
FIG. 2 is a diagram schematically illustrating an example of a configuration of a step structure body of the nonvolatile memory according to the embodiment.

Next, a step-shaped structure provided in the nonvolatile memory 10 will be described with reference to FIG. 2. FIG. 2 is a diagram schematically illustrating an example of the configuration of step structure bodies LBa and LBb of the nonvolatile memory 10 according to the embodiment. In addition, in FIG. 2, the substrate Sub and the like under the stack body LB is omitted. In addition, after that, word line WL and selection gate lines SGS and SGD are sometimes referred to as word line WL without any distinction.

As illustrated in FIG. 2, outside the memory cell array MA, the stack body LB has the step structure bodies LBa and LBb. The step structure bodies LBa and LBb are in a relationship of mirror images in which the structures of the step structure bodies LBa and LBb are inverted from each other, and are separated by the slit ST.

The step structure bodies LBa and LBb have a step-shaped structure in which word lines WL and interlayer insulating layers ID stacked alternately in unit of three layers are set as one step in the X direction. In addition, the step structure bodies LBa and LBb have a step-shaped structure in which the word line WL and the interlayer insulating layer ID that are stacked in unit of one layer are set as one step in the Y direction. A terrace portion LBtr which is a flat portion of each step of the step structure bodies LBa and LBb is configured with an interlayer insulating layer ID.

A lead wire line LL made of the same material as the conductive layer constituting, for example, the word line WL is provided on the terrace portion LBtr of each step. Each lead wire line LL is connected to the lowermost word line WL included in the upper step of the step to which the terrace portion LBtr provided with the lead wire line LL belongs in the X direction and the Y direction and functions as a conductor line of the word line WL. For example, a lead wire line LL1 is connected to a word line WL1 of the first layer and functions as a conductor line of the word line WL1. A lead wire line LL5 is connected to a word line WL5 of the fifth layer and functions as a conductor line of the word line WL5.

By having a predetermined thickness, the lead wire line LL has an upper surface higher than the upper surface of the word line WL to which the lead wire line LL itself is connected. For example, the upper surface of the lead wire line LL1 is higher than the upper surface of the word line WL1. The upper surface of the lead wire line LL5 is higher than the upper surface of the word line WL5.

Each of the lead wire lines LL is provided with a contact CT connecting the wire lines on the upper layer of the step structure bodies LBa and LBb and the lead wire line LL. For example, a contact CT1 is connected to the lead wire line LL1, and the contact CT1 is electrically connected to the word line WL1 via the lead wire line LL1. A contact CT5 is connected to the lead wire line LL5, and the contact CT5 is electrically connected to the word line WL5 via the lead wire line LL5.

In the X direction, a spacer (not illustrated) configured with an insulating layer such as a silicon oxide is provided on a step portion LBst which is a side surface of each step connecting the terrace portions LBtr of each step in the height direction. The function of the spacer will be described with reference to FIGS. 3A and 3B.

Figure 3A:
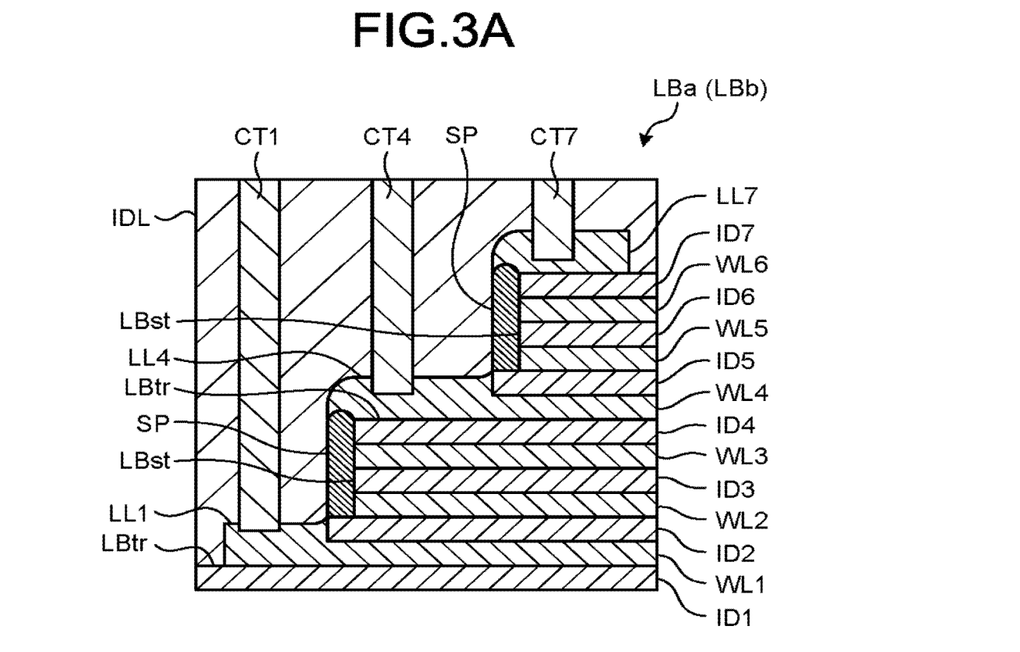
FIG. 3A is a cross-sectional view illustrating an example of the configuration of the step structure body of the nonvolatile memory according to the embodiment.
Figure 3B:
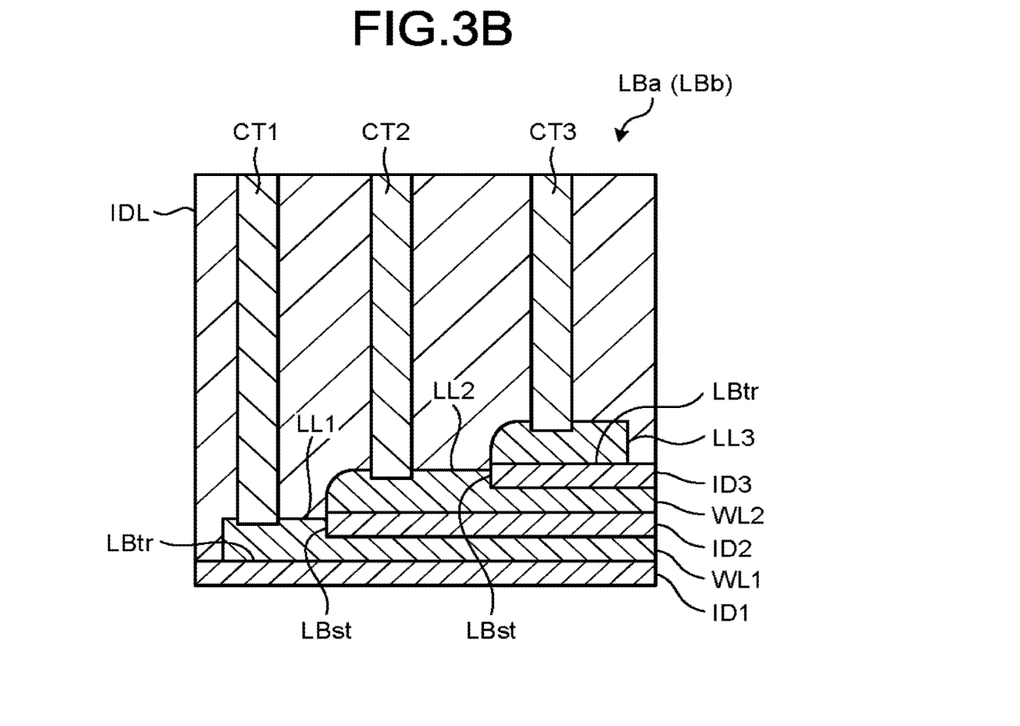
FIG. 3B is a cross-sectional view illustrating an example of the configuration of the step structure body of the nonvolatile memory according to the embodiment.

FIGS. 3A and 3B are cross-sectional views illustrating an example of the configuration of the step structure bodies LBa and LBb of the nonvolatile memory 10 according to the embodiment. FIG. 3A is a cross-sectional view taken along the X direction of FIG. 2, and FIG. 3B is a cross-sectional view taken along the Y direction of FIG. 2. The film covering the whole of the step structure bodies LBa and LBb is an insulating film IDL.

As illustrated in FIG. 3A, a lowermost interlayer insulating layer ID1 of the step structure bodies LBa and LBb constitutes a terrace portion LBtr having no step portion LBst.

The first step of the step structure bodies LBa and LBb is configured with the word lines WL1 to WL3 and interlayer insulating layers ID2 to ID4, and the terrace portion LBtr is configured with the interlayer insulating layer ID4. In the step portion LBst, the word line WL1 and the interlayer insulating layer ID2 slightly protrude beyond the other word lines WL2 and WL3 and the interlayer insulating layers ID3 and ID4.

The spacers SP are provided on the protruding portions of the word line WL1 and the interlayer insulating layer ID2 so as to cover the step portion LBst of the word lines WL2 and WL3 and the interlayer insulating layers ID3 and ID4. The height of the lead wire line LL1 for leading out the word line WL1 is substantially lower than the upper surface of the interlayer insulating layer ID2, but in the portion in contact with the step portion LBst of the first step, a portion of the lead wire line LL1 reaches the height of the lower portion of the word line WL2. However, since the spacer SP covers the word line WL2, the lead wire line LL1 and the word line WL2 are insulated from each other.

The second step of the step structure bodies LBa and LBb is configured with word lines WL4 to WL6 and interlayer insulating layers ID5 to ID7, and the terrace portion LBtr is configured with the interlayer insulating layer ID7. In the step portion LBst, the word line WL4 and the interlayer insulating layer ID5 slightly protrude beyond the other word lines WL5 and WL6 and the interlayer insulating layers ID6 and ID7.

The spacers SP are provided on the protruding portions of the word line WL4 and the interlayer insulating layer ID5 so as to cover the step portions LBst of the word lines WL5 and WL6 and the interlayer insulating layers ID6 and ID7. The height of the lead wire line LL4 for leading out the word line WL4 is substantially lower than the upper surface of the interlayer insulating layer ID5, but in the portion in contact with the step portion LBst of the second step, a portion of the lead wire line LL4 reaches the height of the lower portion of the word line WL5. However, since the spacer SP covers the word line WL5, the lead wire line LL4 and the word line WL5 are insulated from each other.

As illustrated in FIG. 3B, the lowermost interlayer insulating layer ID1 of the step structure bodies LBa and LBb constitutes a terrace portion LBtr having no step portion LBst. The first step of the step structure bodies LBa and LBb is configured with the word line WL1 and the interlayer insulating layer ID2, and the terrace portion LBtr is configured with the interlayer insulating layer ID2. The height of the lead wire line LL1 is generally lower than the upper surface of the interlayer insulating layer ID2. The second step of the step structure bodies LBa and LBb is configured with the word line WL2 and the interlayer insulating layer ID3, and the terrace portion LBtr is configured with the interlayer insulating layer ID3. The height of the lead wire line LL2 is generally lower than the upper surface of the interlayer insulating layer ID3. The step structure bodies LBa and LBb do not have spacers in the step portions LBst in the Y direction.

(Example of Process of Manufacturing Nonvolatile Memory)

Next, an example of a process of manufacturing the step structure bodies LBa and LBb will be described as an example of a process of manufacturing the nonvolatile memory 10 with reference to FIGS. 4A to 7B. FIGS. 4A to 7B are flowcharts illustrating an example of the procedure of the process of manufacturing the nonvolatile memory 10 according to the embodiment. The left diagram of FIGS. 4A to 7B are cross-sectional views taken along the X direction of the step structure bodies LBa and LBb in the manufacturing process. The right diagram of FIGS. 4A to 7B are cross-sectional views taken along the Y direction of the step structure bodies LBa and LBb in the manufacturing process.

First, an example of the manufacturing process in the X direction will be described.

Figure 4A:
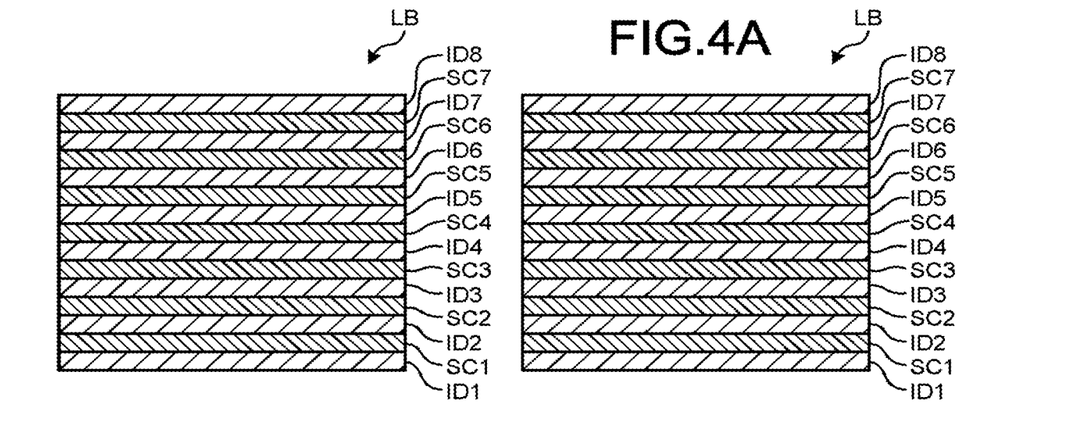
FIG. 4A is a flowchart illustrating an example of a procedure of a process of manufacturing the nonvolatile memory according to the embodiment.

As illustrated in the left diagram of FIG. 4A, a stack body LB in which a plurality of sacrificial layers SC and a plurality of interlayer insulating layers ID are alternately stacked is formed on the substrate Sub (refer to FIG. 1). The stack body LB is configured with, for example, seven sacrificial layers SC1 to SC7 and eight interlayer insulating layers ID1 to ID8. The sacrificial layers SC1 to SC7 are layers which are configured with the insulating layers of which types are different from those of the insulating layers constituting the interlayer insulating layers ID1 to ID8 and which can be replaced with conductive layers which are to be the word lines WL1 to WL7 later. More specifically, the insulating layer constituting the interlayer insulating layers ID1 to ID8 is, for example, a silicon oxide or the like, and the insulating layer constituting the sacrificial layers SC1 to SC7 is, for example, a silicon nitride or the like.

Figure 4B:
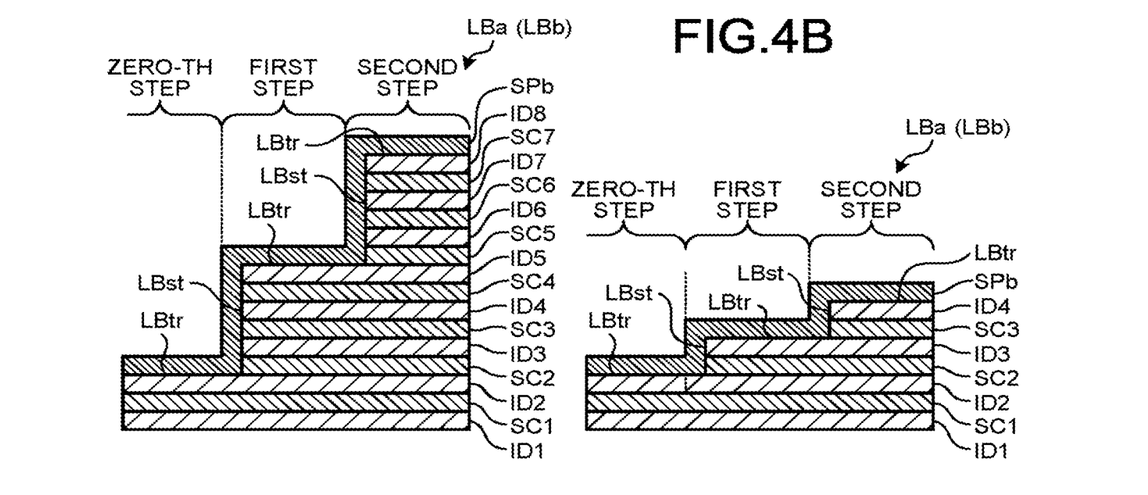
FIG. 4B is a flowchart illustrating an example of the procedure of the process of manufacturing the nonvolatile memory according to the embodiment.

As illustrated in the left diagram of FIG. 4B, the step structure bodies LBa and LBb are formed. However, at this time, the slit ST (refer to FIG. 2) is not formed in the step structure bodies LBa and LBb, and the step structure bodies LBa and LBb are not separated from each other.

The step structure bodies LBa and LBb are configured with, for example, two steps. The second step from the bottom is configured with the sacrificial layers SC5 to SC7 and the interlayer insulating layers ID6 to ID8, and the terrace portion LBtr of the second step is configured with the interlayer insulating layer ID8. The first step from the bottom is configured with the sacrificial layers SC2 to SC4 and the interlayer insulating layers ID3 to ID5, and the terrace portion LBtr of the first step is configured with the interlayer insulating layer ID5. Below the first step, only the terrace portion LBtr having no step portion LBst is formed. For the convenience, the configuration of only the terrace portion LBtr is set to be the zero-th step. The terrace portion LBtr at the zero-th step is configured with the interlayer insulating layer ID2.

An insulating layer SPb is formed covering the terrace portion LBtr and the step portion LBst of each of the step structure bodies LBa and LBb. The insulating layer SPb is made of, for example, a silicon oxide or the like and is to be the spacer SP of the step portion LBst later.

Figure 4C:
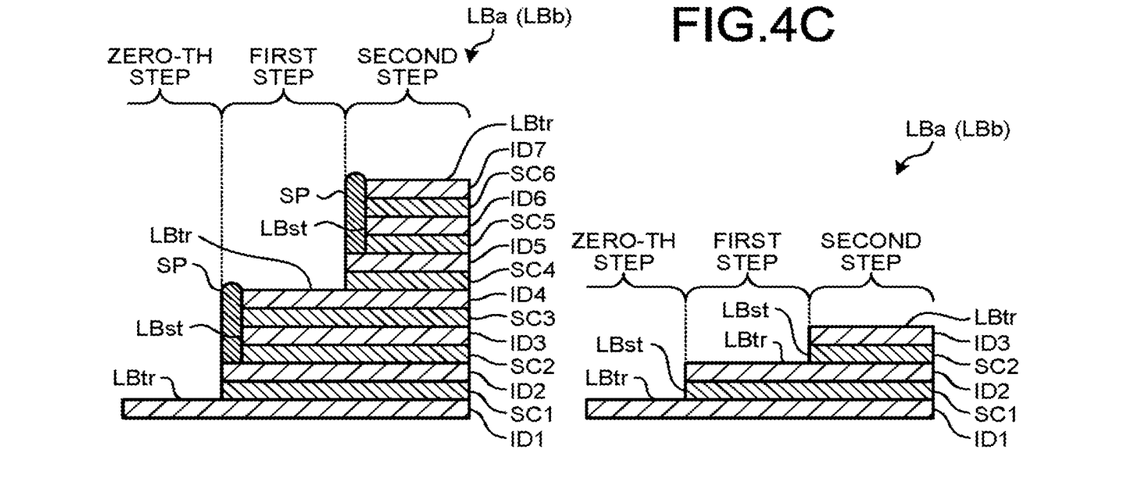
FIG. 4C is a flowchart illustrating an example of the procedure of the process of manufacturing the nonvolatile memory according to the embodiment.

As illustrated in the left diagram of FIG. 4C, etch back is performed on the step structure bodies LBa and LBb, so that the insulating layer SPb, the interlayer insulating layer ID, and the sacrificial layer SC are removed in unit of one layer from each terrace portion LBtr. At this time, it is preferable to remove these layers by using an etching condition with high anisotropy by dry etching, chemical dry etching, wet etching, or the like.

Accordingly, each step of the step structure bodies LBa and LBb is configured with a combination of a new sacrificial layer SC and an interlayer insulating layer ID. The second step is configured with the sacrificial layers SC4 to SC6 and the interlayer insulating layers ID5 to ID7, and the newly exposed interlayer insulating layer ID7 constitutes the terrace portion LBtr of the second step. The first step is configured with sacrificial layers SC1 to SC3 and the interlayer insulating layers ID2 to ID4, and the newly exposed interlayer insulating layer ID4 constitutes the terrace portion LBtr of the first step. The newly exposed interlayer insulating layer ID1 constitutes the terrace portion LBtr of the zero-th step.

In addition, the spacer SP is formed by the insulating layer SPb remaining without being removed in the step portion LBst of each step. The spacer SP of the second step covers the sacrificial layers SC5 and SC6 and the interlayer insulating layers ID6 and ID7 and the sacrificial layer SC4 and the interlayer insulating layer ID5 newly belonging to the second step are exposed to the step portion LBst. The spacer SP of the first step covers the sacrificial layers SC2 and SC3 and the interlayer insulating layers ID3 and ID4, and the sacrificial layer SC1 and the interlayer insulating layer ID2 newly belonging to the first step are exposed to the step portion LBst.

Figure 5A:
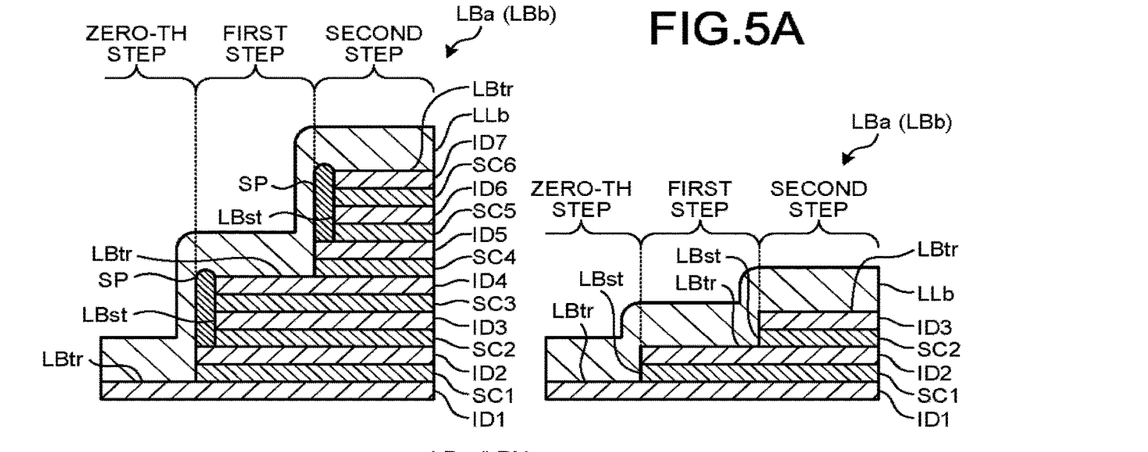
FIG. 5A is a flowchart illustrating an example of the procedure of the process of manufacturing the nonvolatile memory according to the embodiment.

As illustrated in the left diagram of FIG. 5A, a sacrificial layer LLb is formed covering the newly formed terrace portion LBtr and the newly formed step portion LBst of each of the step structure bodies LBa and LBb. The sacrificial layer LLb is a layer which is configured with an insulating layer of which type is the same as that of the insulating layer constituting the sacrificial layers SC1 to SC6 and which can be replaced with a conductive layer which is to the lead wire line LL later.

In addition, at this time, it is preferable to form the sacrificial layer LLb by an anisotropic film forming method such that the sacrificial layer LLb of the terrace portion LBtr is thicker than the sacrificial layer LLb of the step portion LBst. More specifically, it is preferable to form the sacrificial layer LLb such that the sacrificial layer LLb of the terrace portion LBtr has a thickness about twice that of the sacrificial layer LLb of the step portion LBst. Such a sacrificial layer LLb can be formed by using high density plasma chemical vapor deposition (HDP-CVD), plasma CVD, or the like using a condition in which the growth rate in the stacking direction is higher than the growth rate in the direction parallel to the substrate Sub.

Figure 5B:
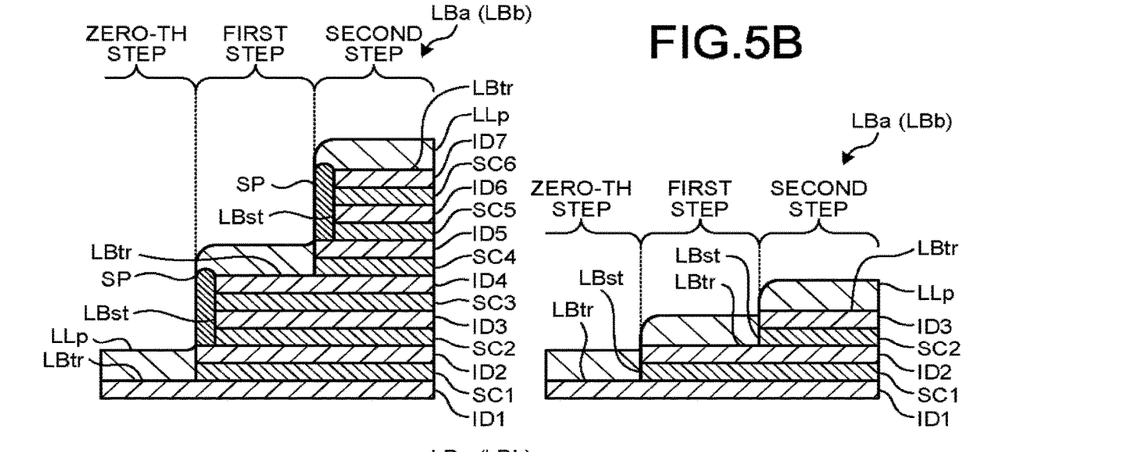
FIG. 5B is a flowchart illustrating an example of the procedure of the process of manufacturing the nonvolatile memory according to the embodiment.

As illustrated in the left diagram of FIG. 5B, etch back is performed on the step structure bodies LBa and LBb, and the sacrificial layer LLb is removed from each of the step portions LBst. At this time, it is preferable to remove the sacrificial layer LLb by using isotropic etching conditions by dry etching, chemical dry etching, wet etching, or the like.

Accordingly, the sacrificial layer LLb formed on each of the terrace portion LBtr is separated from the sacrificial layer LLb formed on the other terrace portion LBtr to be a sacrificial layer LLp is connected to the lowermost sacrificial layer SC of the upper step of the terrace portion LBtr in which the sacrificial layer LLb itself is formed.

In addition, at this time, the sacrificial layer LLb is etched back, so that the thickness of the sacrificial layer LLp is reduced to a predetermined thickness. Herein, in accordance with the manufacturing process in the Y direction described later, for example, the upper surface of the sacrificial layer LLp is lower than the lower surface of the upper sacrificial layer SC above the lowermost sacrificial layer SC in the upper step. However, a portion of the sacrificial layer LLp may remain in the step portion LBst, so that a portion of the sacrificial layer LLp may be higher than the lower surface of the upper sacrificial layer SC above the lowermost sacrificial layer SC in the upper step. Even in this case, the sacrificial layer LLp and the upper sacrificial layer SC are separated by the spacer SP.

Figure 5C:
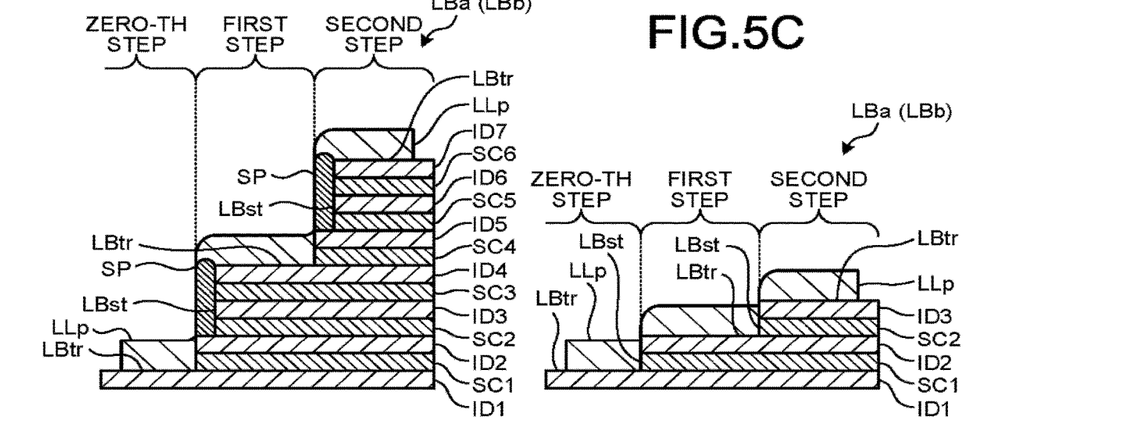
FIG. 5C is a flowchart illustrating an example of the procedure of the process of manufacturing the nonvolatile memory according to the embodiment.

As illustrated in the left diagram of FIG. 5C, unnecessary portions of the sacrificial layer LLp are removed. The unnecessary portions of the sacrificial layer LLp can be removed by etching by using a photolithography technique.

Figure 6A:
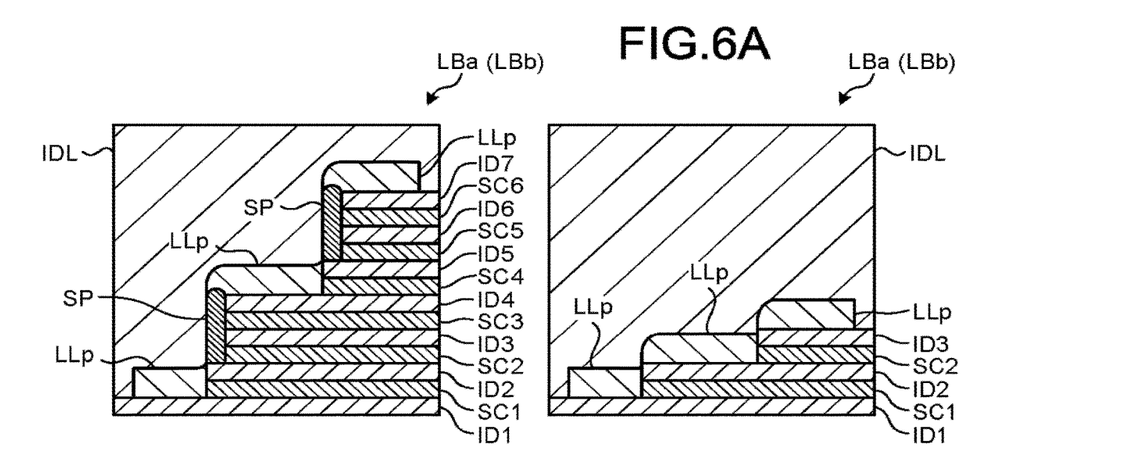
FIG. 6A is a flowchart illustrating an example of the procedure of the process of manufacturing the nonvolatile memory according to the embodiment.

As illustrated in the left diagram of FIG. 6A, the interlayer insulating film IDL is formed so as to cover the entire step structure bodies LBa and LBb. In addition, the slit ST (refer to FIG. 2) separating the step structure bodies LBa and LBb is formed.

Figure 6B:
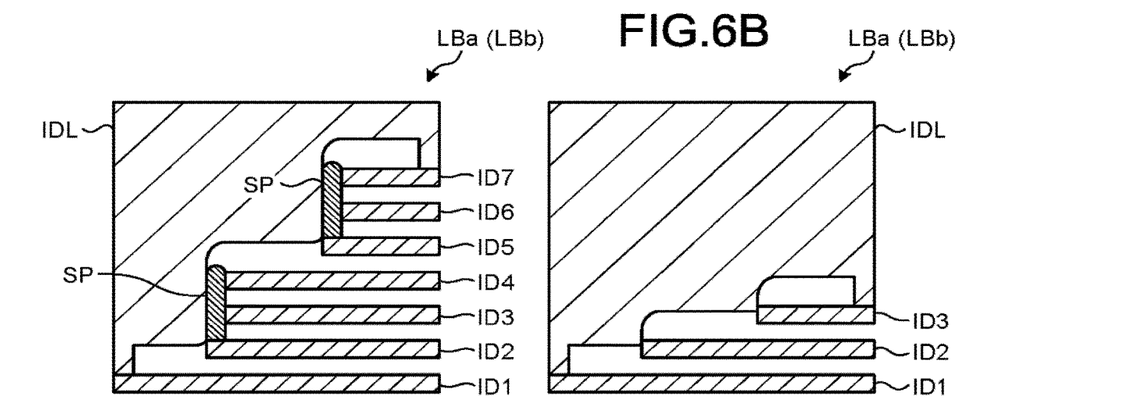
FIG. 6B is a flowchart illustrating an example of the procedure of the process of manufacturing the nonvolatile memory according to the embodiment.

As illustrated in the left diagram of FIG. 6B, the sacrificial layers SC1 to SC6 and LLp are removed through the slit ST illustrated in FIG. 2. Accordingly, voids are generated at the locations where the sacrificial layers SC1 to SC6 and LLp have existed.

Figure 6C:
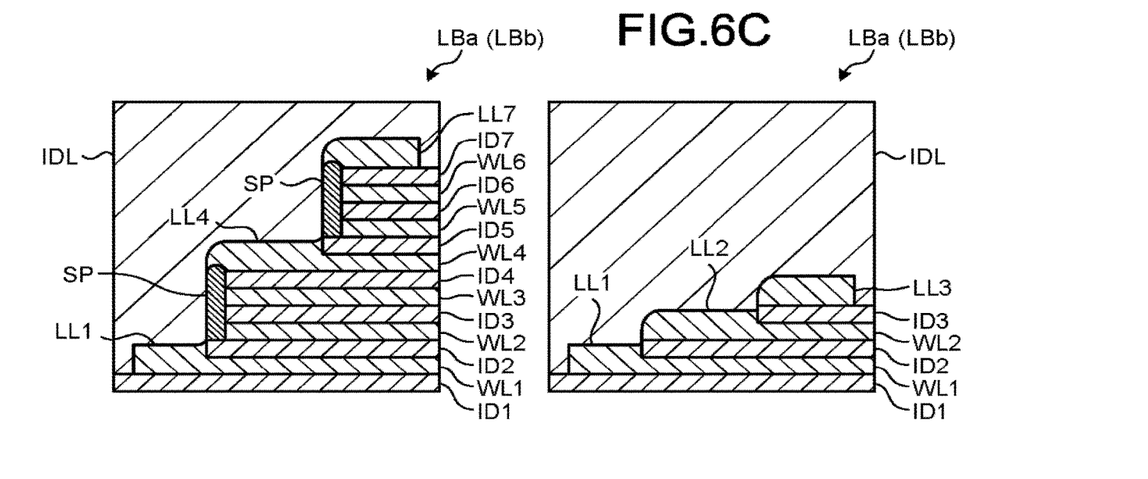
FIG. 6C is a flowchart illustrating an example of the procedure of the process of manufacturing the nonvolatile memory according to the embodiment.

As illustrated in the left diagram of FIG. 6C, the voids generated at the locations where the sacrificial layers SC1 to SC6 and LLp have existed are filled with a conductor such as tungsten through the slit ST illustrated in FIG. 2. Accordingly, the word lines WL1 to WL6 and the lead wire lines LL1, LL4, and LL7 are formed.

Figure 7A:
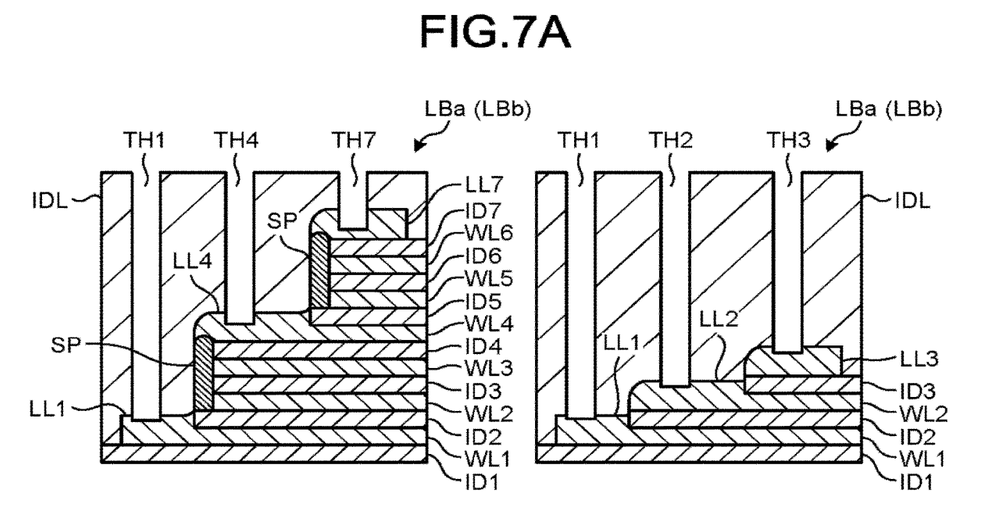
FIG. 7A is a flowchart illustrating an example of the procedure of process of manufacturing the nonvolatile memory according to the embodiment.

As illustrated in the left diagram of FIG. 7A, through holes TH1, TH4, and TH7 reaching the lead wire lines LL1, LL4, and LL7 are formed in the interlayer insulating film IDL on the lead wire lines LL1, LL4, and LL7. The through holes TH1, TH4, and TH7 are collectively formed by etching by using a photolithography technique. For this reason, in order to form the through hole TH1 reaching the lead wire line LL1, excessive overetching is applied to the through holes TH4 and TH7. However, the lead wire lines LL1 and LL4 are thicker than the interlayer insulating layers ID2 and ID5, and the lead wire lines LL1 and LL4 are thicker than the word lines WL1 and WL4, respectively. The same can be said for the lead wire line LL7. In this manner, since the lead wire lines LL1, LL4, and LL7 are thickened, it is suppressed that the lead wire lines LL4 and LL7 penetrate (punch through).

Figure 7B:
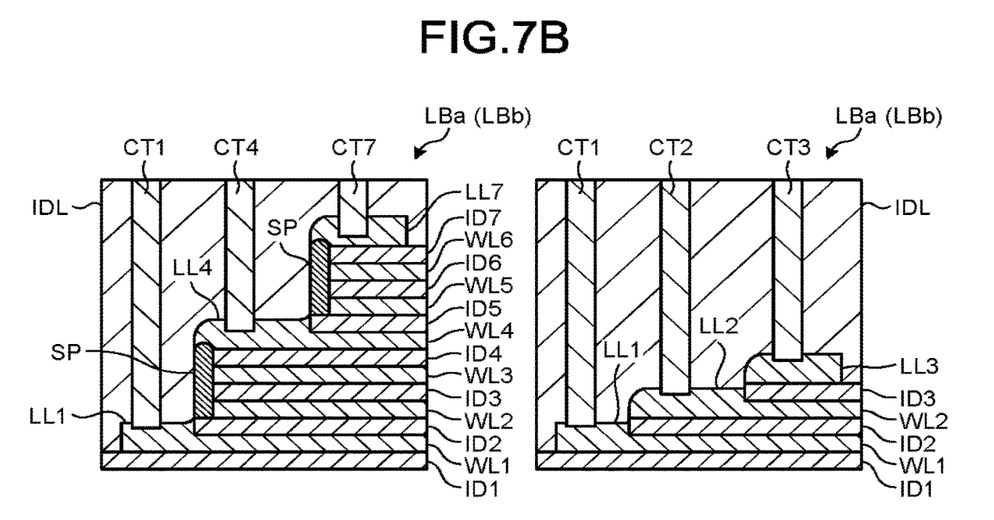
FIG. 7B is a flowchart illustrating an example of the procedure of process of manufacturing the nonvolatile memory according to the embodiment.

As illustrated in the left diagram of FIG. 7B, the contacts CT1, CT4, and CT7 are formed by burying a conductor such as tungsten in the through holes TH1, TH4, and TH7. After that, upper layer wire lines and the like connected to the contacts CT1, CT4, and CT7 and the like are formed on the upper layers of the contacts CT1, CT4, and CT7, and the upper layer wire lines are connected to a row decoder or the like that controls each word line WL.

The manufacturing process in the Y direction is also performed in parallel with the manufacturing process in the X direction.

As illustrated in the right diagram of FIG. 4A, the stack body LB in which the sacrificial layers SC1 to SC7 and the interlayer insulating layers ID1 to ID8 are alternately stacked is formed on the substrate Sub.

As illustrated in the right diagram of FIG. 4B, for example, two step structure bodies LBa and LBb are formed. The second step from the bottom is configured with the sacrificial layer SC3 and the interlayer insulating layer ID4. The first step from the bottom is configured with the sacrificial layer SC2 and the interlayer insulating layer ID3. The terrace portion LBtr at the zero-th step is configured with the interlayer insulating layer ID2. The insulating layer SPb is formed covering the terrace portion LBtr and the step portion LBst of each of the step structure bodies LBa and LBb.

As illustrated in the right diagram of FIG. 4C, etch back is performed on the step structure bodies LBa and LBb, so that the insulating layer SPb, the interlayer insulating layer ID, and the sacrificial layer SC are removed in unit of one layer from each terrace portion LBtr. At this time, the insulating layer SPb is also removed from each step portion LBst, and the insulating layer SPb disappears.

Accordingly, the second step is configured with the sacrificial layer SC2 and the interlayer insulating layer ID3, and the newly exposed interlayer insulating layer ID3 constitutes the terrace portion LBtr of the second step. The first step is configured with the sacrificial layer SC1 and the interlayer insulating layer ID2, and the newly exposed interlayer insulating layer ID2 constitutes the terrace portion LBtr of the first step. The newly exposed interlayer insulating layer ID1 constitutes the terrace portion LBtr of the zero-th step.

As illustrated in the right diagram of FIG. 5A, the sacrificial layer LLb is formed to cover the newly formed terrace portion LBtr and the newly formed step portion LBst of each of the step structure bodies LBa and LBb.

As illustrated in the right diagram of FIG. 5B, etch back is performed on the step structure bodies LBa and LBb, and the sacrificial layer LLb is removed from each step portion LBst. At this time, the thickness of the sacrificial layer LLp is reduced until the upper surface of each sacrificial layer LLp becomes lower than the lower surface of the upper sacrificial layer LLp.

Accordingly, the sacrificial layer LLb formed on each of the terrace portion LBtr is separated from the sacrificial layer LLb formed on the other terrace portion LBtr to be a sacrificial layer LLp connected to the sacrificial layer SC of the upper step of the terrace portion LBtr in which the sacrificial layer LLb itself is formed.

As illustrated in the right diagram of FIG. 5C, unnecessary portions of the sacrificial layer LLp are removed.

As illustrated in the right diagram of FIG. 6A, an interlayer insulating film IDL is formed so as to cover the entire step structure bodies LBa and LBb. In addition, a slit ST (refer to FIG. 2) separating the step structure bodies LBa and LBb is formed.

As illustrated in the right diagram of FIG. 6B, the sacrificial layers SC1 to SC3 and LLp are removed through the slit ST illustrated in FIG. 2.

As illustrated in the right diagram of FIG. 6C, the voids generated at the locations where the sacrificial layers SC1 to SC3 and LLp have existed are filled with the conductor through the slit ST illustrated in FIG. 2, so that the word lines WL1 to WL3 and lead wire lines LL1 to LL3 are formed.

As illustrated in the right diagram of FIG. 7A, the through holes TH1 to TH3 reaching the lead wire lines LL1 to LL3 are formed in the interlayer insulating film IDL on the lead wire lines LL1 to LL3.

As illustrated in the right diagram of FIG. 7B, the contacts CT1 to CT3 are formed by burying a conductor in the through holes TH1 to TH3. The contacts CT1 to CT3 are connected to a row decoder or the like via an upper layer wire line or the like.

Comparative Example

Figure 8:
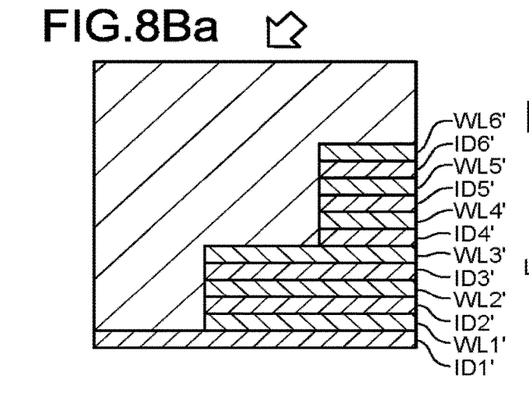
Figure 8A:
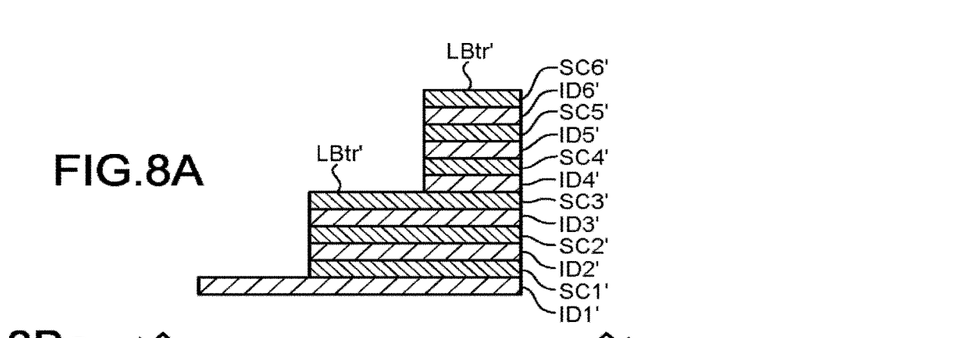
FIG. 8A is a diagram illustrating a step structure body of a nonvolatile memory according to Comparative Example.

Next, the step structure body of Comparative Example will be described with reference to FIGS. 8A to 8Cb. FIGS. 8A to 8Cb are diagrams illustrating the step structure body of the nonvolatile memory according to Comparative Example. As a simple structure for leading out word lines to the outside of the memory cell array, it is considered that the terrace portion is configured with the word lines.

That is, it is considered that, as illustrated in FIG. 8A, each terrace portion LBtr' forms a step structure body configured with sacrificial layers SC3' and SC6', and as illustrated in FIG. 8Ba, the sacrificial layers are replaced with the word lines WL3' and WL6'. However, as illustrated in FIG. 8Ca, when through holes TH1', TH3', and TH6' are formed such that the through hole TH1' reaches the word line WL1', excessive overetching is applied in the through holes TH3' and TH6', and thus, there is a concern that the word lines WL3' and WL6' may penetrate (punch through PT). In the example of FIG. 8Ca, the through hole TH6' reaches the word line WL5', and if the contact is buried as it is, the word lines WL5' and WL6' are conducted. In addition, the through hole TH3' reaches the interlayer insulating layer ID3', and the withstand voltage of the thin interlayer insulating layer ID3' may not be sufficient, so that there is a concern that a leak current from the word line WL3' flows through the word line WL2'. Therefore, it is considered to increase the thickness of the lead-out word lines WL3' and WL6'.

That is, as illustrated in FIG. 8Bb, a sacrificial layer LLb' covering the terrace portion LBtr' and the step portion LBst' of the step structure body is formed, and as illustrated in FIG. 8Cb, the sacrificial layer LLb' of each terrace portion LBtr' is separated to form a sacrificial layer LLp'. However, at this time, the sacrificial layer LLp' needs also to be separated from the step portion LBst' so as not to be in contact with the sacrificial layer SC' in the upper step. It is very difficult to remove the sacrificial layer LLb' from only the step portion LBst' while maintaining a sufficient layer thickness on the terrace portion LBtr', and thus, a precise process control with no margin is required.

The step structure bodies LBa and LBb included in the nonvolatile memory 10 according to the embodiment include the spacer SP covering the upper word line WL of the step portion LBst. Accordingly, even when the lead wire line LL provided on the terrace portion LBtr in the lower step is thickened, the lead wire line LL can be conducted to the lowermost word line WL in the upper step without conducting with the upper word line WL in the upper step.

The spacers SP of the step structure bodies LBa and LBb included in the nonvolatile memory 10 according to the embodiment can be easily formed by etch back or the like using anisotropic etching. Accordingly, it is possible to increase the thickness of the lead wire line LL without requiring precise process control with no margin.

In addition, in accordance with the manufacturing processing in the Y direction, the upper surface of the lead wire line LL of the step structure bodies LBa and LBb of the nonvolatile memory 10 according to the embodiment is set to be substantially lower than the upper word line WL in the upper step in the X direction, but the embodiment is not limited thereto. In terms of the configuration in the X direction, as long as each of the lead wire lines LL is separated from the other lead wire lines LL, there is no limitation in thickening. More specifically, the thickness of the lead wire line LL in the configuration in the X direction is preferably equal to or larger than 130% of the word line to be connected, more preferably equal to or larger than 150% of the word line to be connected.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A semiconductor memory device comprising:
   a stack body on a substrate, the stack body having a step structure body including a plurality of steps, each step formed with a plurality of sets of stacked layers, each set including a wire line layer and an interlayer insulating layer stacked with each other; and
   memory cells arranged three-dimensionally in the stack body, wherein
   each of the plurality of steps of the step structure body includes an upper wire line layer and a lower wire line layer and a lead wire line that is formed lower than the lower wire line layer; the upper wire line layer, the lower wire line layer; and the lead wire line being insulated from each other by the interlayer insulating layers,
   the step structure body includes:
      a plurality of terrace portions configured with the interlayer insulating layers, the plurality of terrace portions positioned at different heights;
      a plurality of step portions connecting the respective terrace portions in a height direction; and
      insulating layers covering the plurality of step portions, wherein the plurality of steps includes a first step and a second step that is lower than the first step, the lead wire line leads out a lowermost layer of the wire line layers of the first step, which is formed lower than the lower wire line layer of the first step, onto the terrace portion of the second step, and the lead wire line is thicker than the interlayer insulating layers and thicker than the wire line layers in the step structure body.

2. The semiconductor memory device according to claim 1, wherein an upper surface of the lead wire line on the second step is higher than an upper surface of the lowermost layer of the wire line layers of the first step.

3. The semiconductor memory device according to claim 1, wherein an upper surface of at least a portion of the lead wire line on the second step is higher than a lower surface of the lower wire line layer of the first step.

4. The semiconductor memory device according to claim 3, wherein the lead wire line on the second step and the upper wire line layer of the first step are insulated by the insulating layer covering the step portion of the first step.

5. The semiconductor memory device according to claim 1, wherein the plurality of wire line layers are respectively connected to the memory cells arranged at the same height.

6. The semiconductor memory device according to claim 5, wherein the plurality of wire line layers are word lines applying a predetermined voltage to the memory cells.

7. The semiconductor memory device according to claim 6, wherein the predetermined voltage is applied through the lead wire line connected to each of the wire line layers.

8. The semiconductor memory device according to claim 1, wherein a contact connected to a wire line arranged on an upper layer of the step structure body is connected to the lead wire line.

9. The semiconductor memory device according to claim 8, wherein connection depths of the contact with the lead wire lines are different from each other.

\* \* \* \* \*